US012562679B2

(12) United States Patent
Wu

(10) Patent No.: US 12,562,679 B2
(45) Date of Patent: Feb. 24, 2026

(54) SOLAR MODULE FRAME MEMBER

(71) Applicant: REC SOLAR PTE. LTD., Singapore (SG)

(72) Inventor: Meng Hsiu Wu, Singapore (SG)

(73) Assignee: REC SOLAR PTE. LTD., Singapore (SG)

( * ) Notice: Subject to any disclaimer, the term of this patent is extended or adjusted under 35 U.S.C. 154(b) by 33 days.

(21) Appl. No.: 18/260,076

(22) PCT Filed: Dec. 20, 2021

(86) PCT No.: PCT/EP2021/086834
§ 371 (c)(1),
(2) Date: Jun. 30, 2023

(87) PCT Pub. No.: WO2022/144212
PCT Pub. Date: Jul. 7, 2022

(65) Prior Publication Data
US 2024/0063751 A1     Feb. 22, 2024

(30) Foreign Application Priority Data
Dec. 30, 2020     (GB) ..................................... 2020720

(51) Int. Cl.
H02S 30/10     (2014.01)
H02S 40/22     (2014.01)
*H10F 19/80*     (2025.01)

(52) U.S. Cl.
CPC .............. *H02S 30/10* (2014.12); *H02S 40/22* (2014.12); *H10F 19/807* (2025.01)

(58) Field of Classification Search
CPC ..... H02S 30/10; H02S 40/22; H01L 31/0488; H01L 31/048; Y02E 10/52; Y02E 10/50
See application file for complete search history.

(56) References Cited

U.S. PATENT DOCUMENTS

| | | | | |
|---|---|---|---|---|
| 2012/0247533 A1* | 10/2012 | Sanzone | ................. | H02S 40/22 |
| | | | | 136/246 |
| 2019/0371952 A1* | 12/2019 | Zhou | ................... | H01L 31/0504 |

FOREIGN PATENT DOCUMENTS

| | | | | |
|---|---|---|---|---|
| CN | 207096548 | U | * | 3/2018 |
| CN | 207166446 | U | | 3/2018 |
| CN | 208797896 | U | * | 4/2019 |

(Continued)

OTHER PUBLICATIONS

Machine translation CN-207096548-U (Year: 2025).*

(Continued)

*Primary Examiner* — Angelo Trivisonno
(74) *Attorney, Agent, or Firm* — Lee & Hayes, P.C.

(57) ABSTRACT
A frame member for a bifacial solar module. The frame member comprises a retaining portion (or e.g. a holder) configured to retain (or e.g. hold) a longitudinally extending edge of a solar module, such that the solar module, when retained (or e.g. held) by the retaining portion, extends laterally inwardly from the retaining portion along a reference plane. The frame member also includes a reflector surface disposed rearwardly and laterally inwardly of the retaining portion. The reflector surface slopes in a direction away from the reference plane such that light passing through the reference plane and onto the reflector surface is reflected by the reflector surface in a forward and laterally inward direction.

18 Claims, 3 Drawing Sheets

(56)     References Cited

FOREIGN PATENT DOCUMENTS

| | | | |
|---|---|---|---|
| CN | 210899009 | U | 6/2020 |
| CN | 111987975 | A | 11/2020 |
| CN | 112422039 | A | 2/2021 |
| DE | 112014006882 | T5 | 5/2017 |
| FR | 3042354 | A1 | 4/2017 |
| JP | 2015220870 | A | 12/2015 |
| WO | WO2015068538 | A1 | 5/2015 |

OTHER PUBLICATIONS

Machine translation CN-208797896-U (Year: 2025).*
Great Britain Search Report mailed Jun. 24, 2021 in Great Britain Application No. GB2020720.5, a corresponding foreign application, 2 pages.
International Search Report and Written Opinion mailed Apr. 8, 2022 in International Application No. PCT/EP2021/086834, 13 pages.

* cited by examiner

SOLAR MODULE FRAME MEMBER

CROSS REFERENCE TO RELATED APPLICATIONS

This application is a U.S. National Phase Application of International Application No. PCT/EP2021/086834 filed Dec. 20, 2021, which claims priority to Great Britain Application No. 2020720.5 filed Dec. 30, 2020, both of which are incorporated herein by reference in their entirety.

FIELD OF THE DISCLOSURE

The present disclosure relates to frame members for solar modules and solar module assemblies including such frame members.

BACKGROUND

Solar modules (or panels) for providing electrical energy from sunlight comprise an array of solar/photovoltaic cells, each comprising a semiconductor substrate. In most arrangements the solar cells of a solar module are sandwiched between a front glass layer (that faces the sun in use) and a rear (opaque or translucent) backing layer. Such solar modules are sometimes referred to as monofacial solar modules, because they predominantly generate electricity from light incident on the front of the module (i.e. light that passes through the front glass layer).

Another type of solar module is a bifacial solar module. Instead of a rear opaque or translucent backing layer, bifacial solar modules comprise a transparent (e.g. glass) rear layer, such that light can enter the module from both the front and the rear sides of the module. One advantage of bifacial solar modules is that they are able to make use of light that is reflected off the ground (or any structure rearward of the solar module).

Both types of solar modules are typically provided in a frame that extends about a periphery of the solar module. This protects the edges of the solar module and assists in mounting the solar module to a structure (such as tracks installed on the roof of a building). Although such frames will block some light that would otherwise pass through the periphery of the solar module, this is not detrimental to the performance of a module, because the solar cells of a solar module tend to be spaced inwardly from the edges by a small distance (and thus are not blocked by the frame).

Although, in some installations, bifacial solar modules can provide higher energy production and energy yield (energy per watt) than monofacial modules, there is an ongoing need to find further improvements for these types of solar modules.

SUMMARY

According to a first aspect there is provided a frame member for a bifacial solar module, the frame member comprising:

a retaining portion (or e.g. a holder) configured to retain (or e.g. hold) a longitudinally extending edge of a solar module, such that the solar module, when retained (or e.g. held) by the retaining portion, extends laterally inwardly from the retaining portion along a reference plane; and a reflector surface disposed rearwardly and laterally inwardly of the retaining portion, the reflector surface sloping in a direction away from the reference plane such that light passing through the reference plane and onto the reflector surface is reflected by the reflector surface in a forward and laterally inward direction.

The provision of a sloped reflector surface that is disposed rearwardly and laterally inwardly of the retaining portion means that light passing through the solar module (i.e. between the retaining portion and the solar cells of a solar module) may be reflected by the reflector surface. By sloping the surface so as to reflect that light in a forward and laterally inward direction, the reflector surface may direct the light to the solar cells of the solar module, so that the solar cells can use that light to generate electricity. This may increase the performance of the solar module.

The terms "front" and "forward" are used herein to refer to a direction towards a light source (e.g. the sun) in use and orthogonal to a front surface of the solar module, and the terms "rear" and "rearwardly" are intended to refer to a direction that is opposite to the front/forward direction. The term "laterally inwardly" refers to a direction that is both substantially orthogonal to the edge of the solar module and in a direction towards the opposite edge of the solar module.

For the avoidance of doubt, the term "longitudinally" refers to the direction defined by the extension of the edge of the solar module (rather than an axis of the solar module itself). Thus, for example, this term does not require the edge of the solar module to be a long edge of the solar module. The edge of the solar module may be a long edge or a short edge of the solar module (i.e. where the solar module is rectangular but not square).

The reference plane is a plane substantially parallel to upper and lower surfaces of the solar module (when retained by the retaining portion) and that extends through the solar module (e.g. centrally between the upper and lower surfaces).

The entire reflector surface may be laterally inwardly and rearwardly of the retaining portion (i.e. laterally inward of the most laterally inward part of the retaining portion and rearward of the rearmost part of the retaining portion). Alternatively only a portion of the reflector surface may be laterally inwardly and rearwardly of the retaining portion. The arrangement of the reflector surface in this way means that the reflector surface is positioned behind a peripheral region of the solar module through which light is able to pass.

The reflector surface may be arranged such that, in use, a light ray (orthogonal to the reference plane) passing through a first location on the reference plane, and incident on the reflector surface, is reflected by the reflector surface towards a second location on the reference plane spaced laterally inwardly from the first location. The distance between the first and second locations may be greater than 1 mm, or greater than 2 mm, or greater than 3 mm, or greater than 4 mm, or greater than 5 mm, or greater than 10 mm, or greater than 14 mm.

The reflector surface may comprise a curved profile (i.e. the profile taken as a cross-section in a direction transverse to the longitudinal axis). For the avoidance of doubt, the term "curved" is intended to encompass a plurality of linear segments arranged to approximate a curve. The reflector surface may comprise a concave profile. The radius of curvature of the reflector surface may be between 5 mm and 30 mm, or e.g. between 10 mm and 25 mm, or e.g. between 15 mm and 22 mm. In an embodiment, the reflector surface has a substantially constant radius of curvature; however, in some other embodiments, the reflector surface has a varying or non-constant radius of curvature.

The reflector surface may alternatively be substantially planar.

The reflector surface may be elongate in the longitudinal direction. The reflector surface may extend from a longitudinally extending forward edge to a longitudinally extending rearward edge thereof.

The rearward edge may be spaced rearwardly from the retaining portion (e.g. from a rearmost portion of the retaining portion) by a distance of between 10 mm and 50 mm, or between 10 mm and 30 mm, or e.g. about 20 mm. The rearward edge may be spaced rearwardly from the forward edge by a distance of between 10 mm and 50 mm. or between 10 mm and 30 mm, or e.g. about 20 mm.

The rearward edge may be spaced laterally inwardly (e.g. from an inward end of the retaining portion) by a distance of between 5 mm and 40 mm, or between 5 mm and 30 mm, or between 10 mm and 20 mm, or e.g. about 16 mm. The rearward edge may be spaced laterally inwardly from the forward edge by a distance of between 5 mm and 40 mm, or between 5 mm and 30 mm, or between 10 mm and 20 mm, or e.g. about 16 mm.

The retaining portion may comprise a front retaining member and a rear retaining member. The front and rear retaining members may be spaced from one another so as to define a recess (or groove) for receipt of the longitudinally extending edge of the solar module.

The forward edge of the reflector surface may join the reflector surface to the rear retaining member. Alternatively, in another embodiment, the forward edge of the reflector surface may be spaced rearwardly from the retaining portion (e.g. from a rearmost portion of the retaining portion) and/or rearwardly from the rear retaining member.

The reflector surface may be an outer surface of a reflector of the frame member. The reflector may extend rearwardly and laterally inwardly from the rear retaining member. The reflector may be curved and may be concave.

A longitudinally extending rearward end of the reflector may be connected to a base member of the frame member. The base member may extend laterally outwardly from the reflector. The base member may comprise a rearward surface upon which the frame member may be supported in use (e.g. on a structure for supporting the solar module). The base member may be substantially planar. The base member may be used for mounting/fixing the frame member to a further structure. The base member may additionally or alternatively strengthen the frame member for mechanical loading.

The frame member may comprise a longitudinally extending sidewall. The front and rear retaining members may project laterally inwardly from the sidewall. In this respect, the sidewall may define a closed end of the recess (which receives the solar module in use). The front and rear retaining members may have substantially the same width (in the lateral direction). Thus, the front and rear retaining members may project laterally inwardly from the sidewall to substantially the same extent. The base member may be wider (in the lateral direction) than the front and/or rear retaining member. The base member may project laterally inwardly from the sidewall to a greater extent than the front and/or rear retaining member.

The base member may extend laterally inwardly from the sidewall to the rearward end of the reflector. Accordingly, an elongate cavity may be defined between the sidewall, base member, reflector and rear retaining member.

In some embodiments, an intermediate wall may extend rearwardly from the rear retaining member to the base member. In this way, the intermediate wall may divide the elongate cavity into two elongate cavity portions.

The frame member may be elongate (in the longitudinal direction). Accordingly, one or more of the front retaining member, rear retaining member, reflector surface, reflector, base portion and sidewall may be elongate in the longitudinal direction.

The reflector surface may have a constant transverse cross-sectional shape (i.e. profile) for a substantial portion of its length. Accordingly, the reflector surface may be such that (i.e. shaped such that) it is able to be formed by way of an extrusion process.

The reflector surface may be substantially smooth (e.g. untextured and without projections or indentations).

The frame member may have a constant transverse cross-sectional shape (i.e. transverse to the longitudinal axis) for a substantial portion of its length. Thus, for example, the cross-sectional shape may be constant along its length, except at opposing ends at which it may be modified for connection with further like-frame members. For example, each end may be angled to provide connection with a like-frame member oriented perpendicularly to the frame member.

The reflector (and reflector surface) may comprise apertures, recesses, and/or gaps along its length (such that the reflector surface is not continuous for the length of the frame member). These discontinuities may permit access to the base member, which may facilitate mounting of the base member to a structure. Additionally, these discontinuities may permit fixing of one or more reinforcement struts to the frame members. For example the frame member may comprise one or more bores/holes that extend rearwardly from the reflector surface, through the reflector and the base member, for mounting/fixing the frame member to a structure.

Alternatively or additionally, bores/holes may be formed in the base member, and discontinuities (e.g. gaps) in the reflector layer may be provided for access to such bores/holes.

In an embodiment, the reflector (and reflector surface) may extend along a majority of the length of the frame member, i.e. the combined area of the frame member's discontinuities may amount to a minority of the length of the frame member.

The frame member may be able to be (e.g. shaped so as to be able to be) formed by an extrusion process (e.g. may be extrudable). The frame member may be formed by an extrusion process. The frame member may be formed of a metal, such as aluminium.

The reflector surface may comprise a coating applied thereto. The coating may comprise a reflection layer configured to increase the reflectivity of the reflector surface. The coating may comprise a protective layer (e.g. applied to an outer surface of the reflection layer), configured to protect (e.g. prevent corrosion of) the reflection layer.

The coating (e.g. the reflection layer of the coating) may comprise a metal based coating, such as e.g. gold, zinc, copper, platinum, silver or aluminium (and combination thereof). The coating (e.g. the reflection layer if the coating) may be provided by way of a hot-dip galvanizing process, a thermal spraying process, an electroplating process and/or a sherardizing process.

The coating (e.g. the protective layer of the coating) may comprise one or more transparent dielectric materials, such as e.g. silicon oxide, aluminium oxide, titanium oxide, zinc oxide, silicon nitride, magnesium oxide and/or niobium oxide. The coating (e.g. the protective layer of the coating) may be provided by way of an electroplating process, an atomic layer deposition process, a thermal spraying process, a chemical vapour deposition (CVD) process and/or a physical vapour deposition (PVD) process.

In a second aspect there is provided a solar module assembly comprising:

a bifacial solar module comprising an array of solar cells, the array of solar cells spaced from at least one edge of the solar module, such that a peripheral region is defined between the at least one edge and the array of solar cells; and a frame member comprising:

a retaining portion for retaining the at least one edge of the solar module; and a reflector surface rearward of the peripheral region and arranged such that light passing through the peripheral region and onto the reflector is reflected towards the array of solar cells.

The frame member may be as otherwise described above with respect to the first aspect.

The array of solar cells may be spaced from the at least one edge of the solar module by a distance that is greater than 4 mm, or greater than 5 mm, or greater than 8 mm, or greater than 10 mm, or greater than 12 mm, or greater than 15 mm.

The solar module assembly may comprise four frame members, each extending along a respective edge of the solar module (each edge being received in the recess of the corresponding frame member). In this respect, the four frame members may define a frame of the solar module assembly.

The skilled person will appreciate that except where mutually exclusive, a feature or parameter described in relation to any one of the above aspects may be applied to any other aspect. Furthermore, except where mutually exclusive, any feature or parameter described herein may be applied to any aspect and/or combined with any other feature or parameter described herein.

BRIEF DESCRIPTION OF THE DRAWINGS

Embodiments will now be described by way of example only, with reference to the figures, in which.

DETAILED DESCRIPTION

Aspects and embodiments of the present disclosure will now be discussed with reference to the accompanying figures. Further aspects and embodiments will be apparent to those skilled in the art. In the figures, the thicknesses of the layers are exaggerated for clarity. Also, the relative thicknesses of the layers shown in the figures is not necessarily representative of the actual relative thicknesses of the layers in all embodiments.

Figure 1:
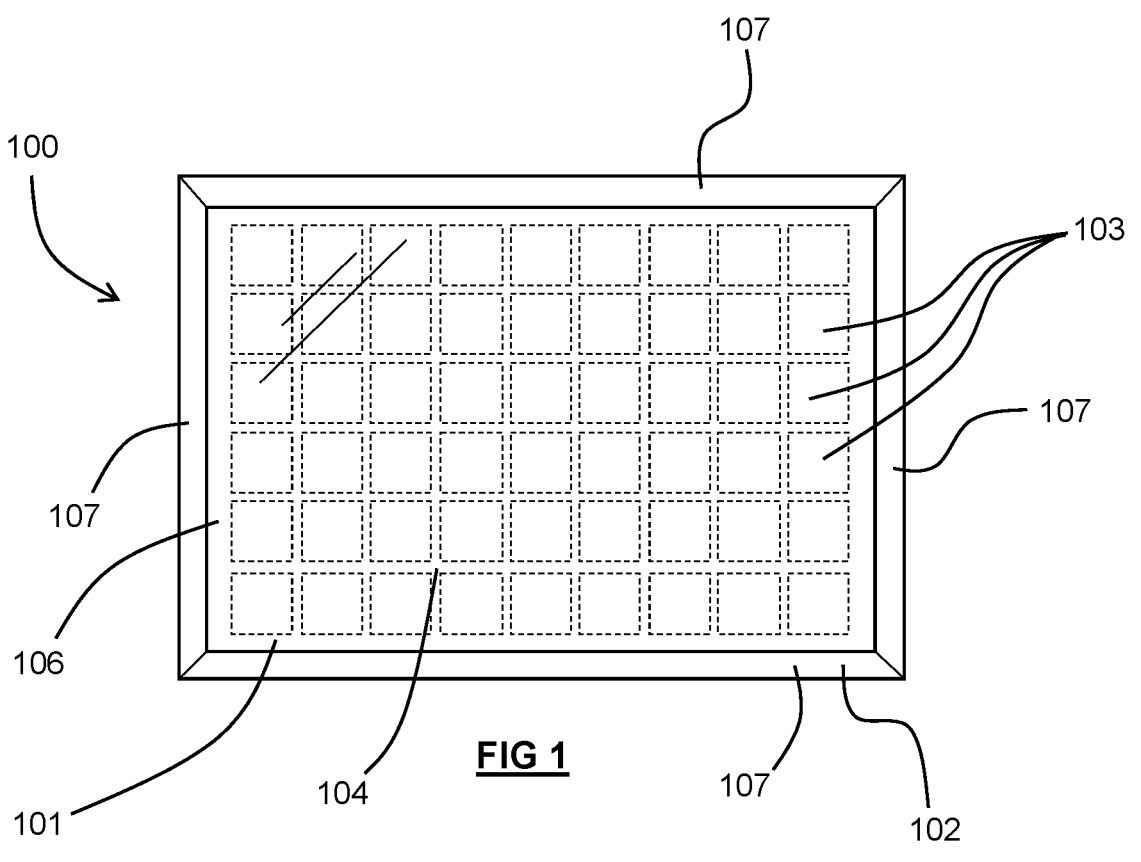
FIG. 1 is a front view of a solar module assembly according to a first embodiment.

FIG. 1 depicts a solar module assembly 100 according to a first embodiment. The solar module assembly 100 comprises a solar module 101 and a rectangular frame 102 extending about a periphery of the solar module 101. The solar module 101 comprises an array of solar cells 103 arranged in a grid-like pattern. The solar cells 103 are sandwiched between front 104 and rear 105 (see FIG. 2) transparent glass layers, such that the solar module 101 is a bifacial solar module. As is apparent from FIG. 1, the arrangement of the solar cells 103 is such that they are spaced from the four edges of the solar module 101. As such, there is a peripheral region 106 of the solar module 101 defined between the frame 102 and the solar cells 103 in which light passes through the solar module 101, without being absorbed by a solar cell 103.

The frame 102 protects the edges of the solar module 101 and provides means for mounting the solar module 101 to a structure (e.g. a structure to which many solar modules 101 may be mounted, such as a building roof). The frame 101 comprises four elongate frame members 107 that are each mounted to, and extend along, a respective edge of the solar module 101. The frame members 107 are connected to one another at their ends, so as to define corners of the frame 102. These connections may be provided by way of brackets or other means (e.g. welding, fasteners, etc.).

Figure 2:
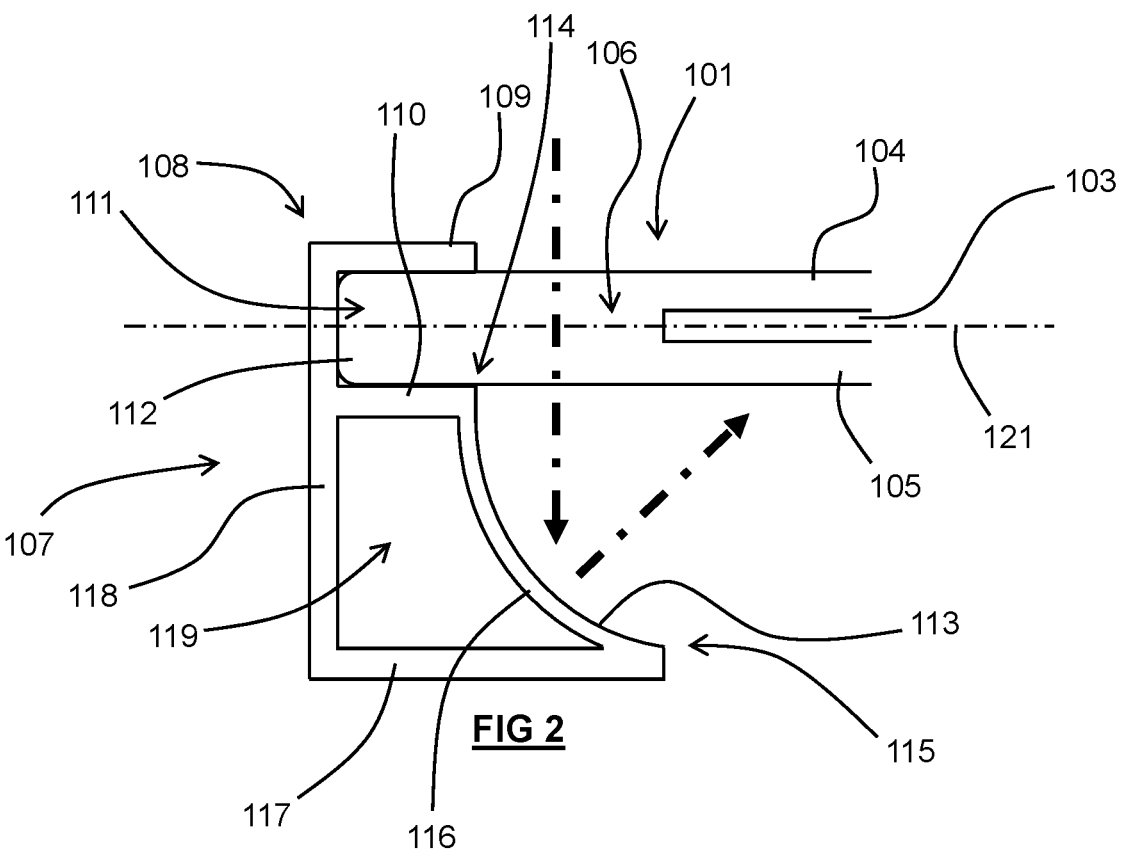
FIG. 2 is a side cross-sectional view of a frame member of the solar module assembly of FIG. 1.

FIG. 2 illustrates a frame member 107 in more detail. It should be appreciated that this detail may be representative of any of the frame members 107 illustrated in FIG. 1. The frame member 107 comprises a retaining portion 108 including front 109 and rear 110 retaining members in the form of elongate longitudinally extending (into the page) flanges. The front 109 and rear 110 retaining members are spaced apart and substantially parallel so as to define a longitudinally extending recess 111 therebetween. A longitudinally extending edge 112 of the solar module 101 is received and retained in this recess 111 (so as to be sandwiched between the front 109 and rear 110 retaining members). In this way, the solar module 101 extends laterally inwardly (i.e. towards the right of the page) along a reference plane 121 (such that the reference plane is substantially parallel to the front and rear surfaces of the solar module 101 and extends substantially centrally therebetween). It is to be understood that the longitudinally extending edge 112 may be either one of the short edges or one of the long edges shown in FIG. 1.

The frame member 107 further comprises a reflector surface 113 that is located both rearwardly (i.e. in a downward direction on the page) and laterally (i.e. in a sideways direction on the page) of the retaining portion 108. In particular, the reflector surface 113 is inward of the retaining portion 108 (i.e. towards an opposite edge of the solar module 101), such that it is positioned behind the peripheral region 106 of the solar module 101. Light incident on this peripheral region 106, as discussed with respect to FIG. 1, is neither reflected by the front retaining member 109 nor absorbed by a solar cell 103. As such, most of this light passes through the glass layers 104, 105 so as to be incident on the reflector surface 113.

The reflector surface 113 is sloped from a front edge 114 that joins with the rear retaining member 110, to a rear edge 115 spaced rearwardly and laterally inwardly from the front edge 114. In this way, the reflector surface 113 slopes in a direction away from the reference plane 121. The reflector surface 113 has a curved concave profile. The result of this configuration of the reflector surface 113 is that light incident thereon (i.e. that has passed through the peripheral region 106 of the solar module 101) is reflected in a direction towards a region of the solar module 101 that is inward of the peripheral region 106 (as depicted by the arrows in FIG. 2). Accordingly, the reflector surface 113 directs light (received via the peripheral region 106) towards the solar cells 103 of the solar module 101, such that the reflected light can be used by the solar cells 103 to generate electricity. Thus, the solar module 101 is able to make use of light that would otherwise continue on a trajectory rearward of the solar module 101 (in the absence of any surface behind the peripheral region 106) or that would be reflected 180 degrees and pass straight back through the peripheral region 106 without being absorbed by a solar cell 103 (in the absence of a reflector surface that is sloped with respect to the solar module).

The reflector surface 113 is an outer surface of a concave reflector 116 that extends laterally inwardly and rearwardly from the rear retaining member 110. The reflector 116, and consequently the reflector surface 113, are elongate in the longitudinal direction and extend for the length of the frame member 107.

The rearward end of the reflector 116 is joined to a planar base member 117 that extends laterally outwardly from the reflector 116. In use, the frame member 107 may be supported on a lower surface of the base member 117.

The frame member 107 is also provided with a sidewall 118 from which each of the front retaining member 109, rear retaining member 110 and base member 118 extend laterally inwardly. Thus, a forward portion of the sidewall 118, between the front 109 and rear 110 retaining members defines a closed end of the recess 111, against which the edge 112 of the solar module 101 may abut when received therein. A rearward portion of the sidewall 118, along with the rear retaining member 110, reflector 116, and base member 117, encloses an elongate cavity 119 that extends for the length of the frame member 107.

The frame member 107 has a substantially constant cross-sectional shape along its length, except for at its ends, which are angled for connection with adjacent frame members 107 (as depicted in FIG. 1). Accordingly the frame member 107 may be formed by an extrusion process (with the ends subsequently being machined/cut), and may be formed of e.g. aluminium.

Figure 3:
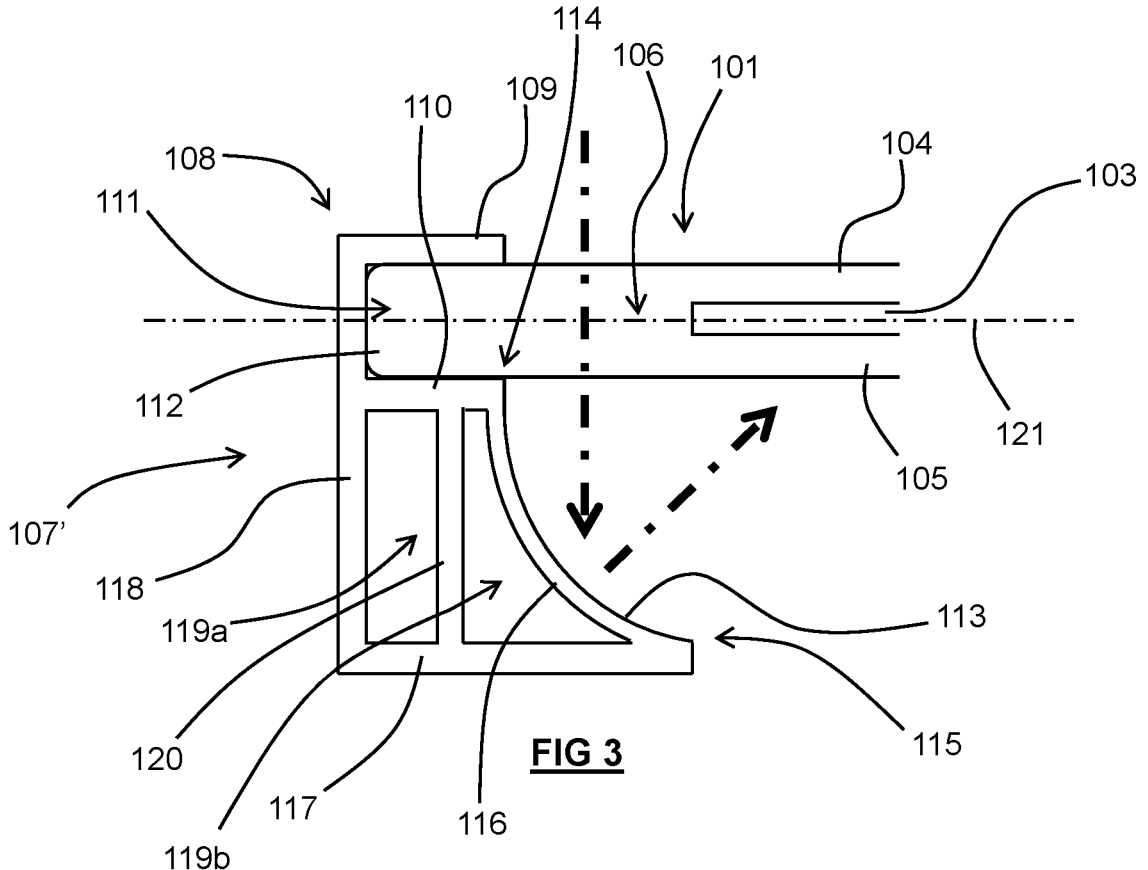
FIG. 3 is a side cross-sectional view of a frame member of a solar module assembly according to a second embodiment.

FIG. 3 depicts a frame member 107' according to a second embodiment, which is a variation of the frame member 107 shown in FIG. 2 and described above. Each of the frame members 107 of FIG. 1, may instead be in the form of the embodiment illustrated in FIG. 3. The frame member 107' of FIG. 3 includes many of the same features as the frame member 107 of FIG. 2 and, for that reason, corresponding reference numerals have been used.

The embodiment of FIG. 3 differs only in that an intermediate wall 120 is provided between the reflector 116 and the sidewall 118. This intermediate wall 120 extends rearwardly from the rear retaining member 110 to the base member 117 so as to divide the elongate cavity into first 119*a* and second 119*b* elongate cavity portions. The provision of this intermediate wall 120 may increase the strength of the frame member 107'.

Figures 4, 5:
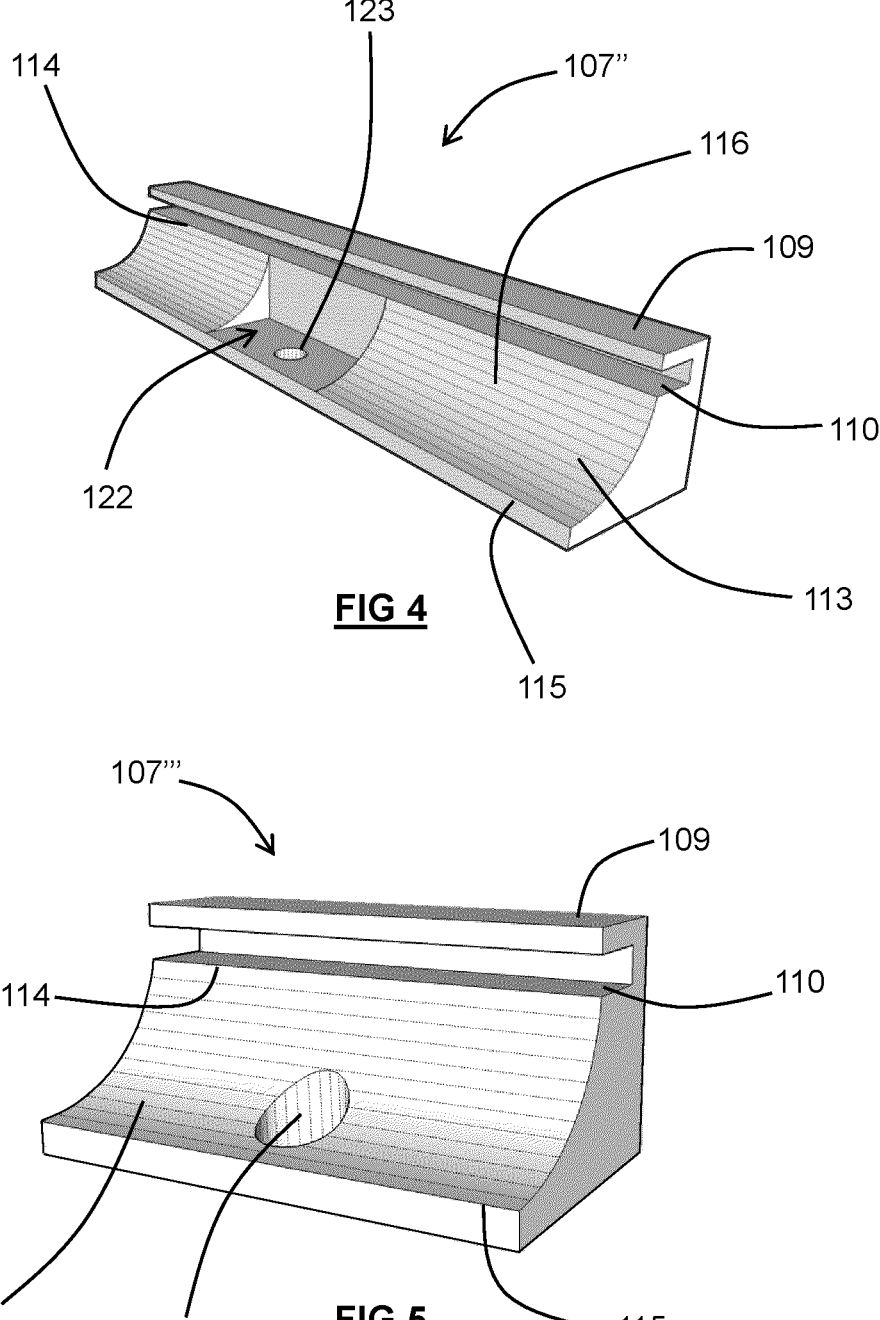
FIG. 4 is a perspective view of a frame member of a solar module assembly according to a third embodiment.
FIG. 5 is a perspective view of a frame member of a solar module assembly according to a fourth embodiment.

FIG. 4 illustrates a third embodiment of a frame member 107'' that represents a further variation of the frame member 107 illustrated in FIG. 2. In this embodiment, the frame member 107'' differs in that the reflector surface 113 is discontinuous, due to a gap formed therein. The gap is a result of a rectangular recess 122 formed in the reflector 116. The recess 122 provides access to a hole 123 that is formed in a base of the recess 122. This hole 123 can be used for mounting/fixing the frame member 107'' to a further structure.

FIG. 5 illustrates a fourth embodiment of a frame member 107'''. In this embodiment, the reflector surface 113 is substantially continuous, except for a hole 123' that extends rearwardly through the frame member 107''' from the reflector surface 113. Again, this hole 123' may be used for mounting/fixing the frame member 107''' to a further structure.

Although the frame members 107'', 107''' of FIGS. 4 and 5 are each depicted as a solid piece, it should be appreciated that they may otherwise comprise cavities so as to have a form that is similar to that shown in FIGS. 2 and 3.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

The invention claimed is:

1. A frame member for a bifacial solar module, the frame member comprising:

a retaining portion configured to retain a longitudinally extending edge of a solar module, such that the solar module, when retained by the retaining portion, extends laterally inwardly from the retaining portion along a reference plane, wherein the retaining portion comprises a front retaining member and a rear retaining member, the front and rear retaining members spaced from one another so as to define a recess for receipt of the longitudinally extending edge of the solar module; and a reflector surface disposed rearwardly and laterally inwardly of the retaining portion, the reflector surface sloping in a direction away from the reference plane such that light passing through the reference plane and onto the reflector surface is reflected by the reflector surface in a forward and laterally inward direction, wherein the reflector surface and the retaining portion form a singular body;

a reflector extending rearwardly and laterally inwardly from the rear retaining member, the reflector surface being an outer surface of the reflector;

a sidewall from which front and rear retaining members project laterally inwardly; and a base member extending laterally inwardly from the sidewall to a rearward end of the reflector;

wherein the reflector extends from the rear retaining member to the base member.

2. A frame member according to claim 1 wherein the reflector surface is arranged such that, in use, a light ray passing through a first location on the reference plane, and incident on the reflector surface, is reflected by the reflector surface towards a second location on the reference plane spaced laterally inwardly from the first location by a distance that is greater than 1 mm.

3. A frame member according to claim 1, wherein the reflector surface comprises a curved profile.

4. A frame member according to claim 3 where the reflector surface comprises a radius of curvature of between 5 and 30 mm.

5. A frame member according to claim 1, wherein the reflector surface comprises a concave profile.

6. A frame member according to claim 1, wherein the reflector surface extends from a front edge to a rear edge.

7. A frame member according to claim 6, wherein the front edge joins the reflector surface to the rear retaining member.

8. A frame member according to claim 6, wherein the rear edge is spaced rearwardly from the retaining portion by a distance of between 10 and 50 mm.

9. A frame member according to claim 6, wherein the rear edge is spaced laterally inwardly from the retaining portion by a distance of between 5 and 40 mm.

10. A frame member according to claim 1 wherein the base member is wider than each of the front and rear retaining members.

11. A frame member according to claim 1, that further comprises an intermediate wall extending rearwardly from the rear retaining member to the base member.

12. A frame member according to claim 1, further comprising a constant transverse cross-sectional shape for a substantial portion of its length.

13. A frame member according to claim 1, wherein the retaining portion or the reflector surface are formed by extrusion.

14. A frame member according to claim 1, wherein the reflector extends from an end of the rear retaining member to an end of the base member.

15. A frame member for a bifacial solar module, the frame member comprising:

retaining portion configured to retain a longitudinally extending edge of a solar module, such that the solar module, when retained by the retaining portion, extends laterally inwardly from the retaining portion along a reference plane;

a reflector surface disposed rearwardly and laterally inwardly of the retaining portion, the reflector surface sloping in a direction a way from the reference plane such that light passing through the reference plane and onto the reflector surface is reflected by the reflector surface in a forward and laterally inward direction, wherein the reflector surface a od the retaining portion form a singular body;

a hole extending through the frame member for mounting the frame member to a further surface, wherein the hole extends from the reflector surface through the frame member.

16. A frame member for a bifacial solar module, the frame member comprising:

retaining portion configured to retain a longitudinally extending edge of a solar module, such that the solar module, when retained by the retaining portion, extends laterally inwardly from the retaining portion along a reference plane;

a reflector surface disposed rearwardly and laterally inwardly of the retaining portion, the reflector surface sloping in a direction a way from the reference plane such that light passing through the reference plane and onto the reflector surface is reflected by the reflector surface in a forward and laterally inward direction, wherein the reflector surface a od the retaining portion form a singular body;

a hole extending through the frame member for mounting the frame member to a further surface; and wherein the reflector surface comprises a recess formed therein such that the reflector surface is discontinuous, and wherein the hole is formed in the recess.

17. A frame member as claimed in claim 1, wherein the sidewall, the rear retaining member, the reflector surface, and the base member enclose an elongate cavity therebetween, and wherein the frame member is formed by extrusion to form an extruded hollow section.

18. A solar module assembly comprising:

a bifacial solar module comprising an array of solar cells, the array of solar cells spaced from at least one edge of the solar module such that a peripheral region is defined between the at least one edge and the array of solar cells; and a frame member comprising:

a retaining portion for retaining the at least one edge of the solar module, the retaining portion comprises a front retaining member and a rear retaining member, the front and rear retaining members spaced from one another so as to define a recess for receipt of the at least one edge of the solar module; and a reflector surface extending from a longitudinally extending forward edge to a longitudinally extending rearward edge thereof, the reflector surface rearward of the peripheral region and arranged such that light passing through the peripheral region and onto the reflector surface is reflected towards the array of solar cells, wherein the reflector surface comprises a curved concave profile, and the reflector surface forms an outer surface of a reflector of the frame member, the reflector extending rearwardly and laterally inwardly from the rear retaining member of the retaining portion.

* * * * *